(12) United States Patent
Jiang et al.

(10) Patent No.: US 9,882,172 B2
(45) Date of Patent: Jan. 30, 2018

(54) OLED BACKPLANE AND FABRICATION METHOD THEREOF

(71) Applicant: BOE TECHNOLOGY GROUP CO., LTD., Beijing (CN)

(72) Inventors: Chunsheng Jiang, Beijing (CN); Jingfei Fang, Beijing (CN); Wei Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 2 days.

(21) Appl. No.: 14/429,047

(22) PCT Filed: Jul. 25, 2014

(86) PCT No.: PCT/CN2014/083076
§ 371 (c)(1),
(2) Date: Mar. 18, 2015

(87) PCT Pub. No.: WO2015/055037
PCT Pub. Date: Apr. 23, 2015

(65) Prior Publication Data
US 2016/0013453 A1    Jan. 14, 2016

(30) Foreign Application Priority Data

Oct. 18, 2013  (CN) .......................... 2013 1 0492625

(51) Int. Cl.
*H01L 51/56* (2006.01)
*H01L 51/52* (2006.01)
*H01L 27/32* (2006.01)

(52) U.S. Cl.
CPC .......... *H01L 51/56* (2013.01); *H01L 27/3244* (2013.01); *H01L 27/3246* (2013.01);
(Continued)

(58) Field of Classification Search
CPC ................ H01L 51/56; H01L 27/3246; H01L 2221/1057; H01L 27/3248
See application file for complete search history.

(56) References Cited

U.S. PATENT DOCUMENTS

2007/0132368 A1* 6/2007 Kuwahara ........... H01L 51/0021
313/503
2008/0111135 A1 5/2008 Choi et al.
(Continued)

FOREIGN PATENT DOCUMENTS

CN    103000580 A    3/2013
CN    103000640 A    3/2013
(Continued)

OTHER PUBLICATIONS

Nov. 4, 2014—(CN) International Search Report for PCT/CN2014/083076.
(Continued)

*Primary Examiner* — Marc Armand
(74) *Attorney, Agent, or Firm* — Banner & Witcoff, Ltd.

(57) ABSTRACT

Disclosed are an OLED backplane and fabrication method. The fabrication method comprises: forming a pattern including a TFT on a substrate; forming a passivation layer on the substrate including the TFT pattern; forming a color filter on the substrate including the passivation layer; forming a resin layer on the substrate including the color filter; heavily doping the resin layer of a first region in each sub-pixel on the substrate including the resin layer, the resin layer in the first region being conductive, the first region including a passivation layer via-hole region, a pixel electrode region and a connecting region between the passivation layer via-hole region and the pixel electrode region, the passivation-layer via-hole region being a position where a drain electrode of the TFT is located; and forming an organic light-emitting layer and a cathode sequentially on the substrate after the resin layer of the first region is heavily doped.

20 Claims, 4 Drawing Sheets

(52) U.S. Cl.
CPC ...... *H01L 27/3258* (2013.01); *H01L 51/5206* (2013.01); *H01L 51/5237* (2013.01)

(56) References Cited

U.S. PATENT DOCUMENTS

| | | | | |
|---|---|---|---|---|
| 2013/0082288 A1* | 4/2013 | Kim | ............... | H01L 27/322 257/89 |
| 2014/0077178 A1* | 3/2014 | Seo | ............... | H01L 27/3258 257/40 |
| 2014/0166997 A1* | 6/2014 | Kim | ............... | H01L 27/1248 257/40 |

FOREIGN PATENT DOCUMENTS

| | | |
|---|---|---|
| CN | 103000661 A | 3/2013 |
| CN | 103500731 A | 1/2014 |

OTHER PUBLICATIONS

Nov. 4, 2014—(CN) Written Opinion for PCT/CN2014/083076—Eng Tran.
May 18, 2017—(EP) Extended European Search Report Appn 14854870.4.

* cited by examiner

OLED BACKPLANE AND FABRICATION METHOD THEREOF

The application is a U.S. National Phase Entry of International Application No. PCT/CN2014/083076 filed on Jul. 25, 2014, designating the United States of America and claiming priority to Chinese Patent Application No. 201310492625.X filed on Oct. 18, 2013. The present application claims priority to and the benefit of the above-identified applications and the above-identified applications are incorporated by reference herein in their entirety.

TECHNICAL FIELD

Embodiments of the invention relate to an Organic Light-Emitting Diode (OLED) backplane and a fabrication method thereof.

BACKGROUND

A current OLED backplane comprises a plurality of sub-pixels arranged in a matrix, as illustrated in FIG. 1, each sub-pixel including a pixel electrode region 1 and a passivation-layer via-hole region 2, a passivation-layer via hole being used for connecting a drain electrode of a thin film transistor (TFT) on a bottom layer and a pixel electrode on an upper layer. A fabrication process of the above-described OLED backplane comprises: as illustrated in FIG. 2, forming a passivation layer 3 on a substrate having a TFT pattern (not illustrated) formed thereon; forming a color filter 4 on the above-described substrate having the passivation layer 3 formed thereon, as illustrated in FIG. 3, depositing a resin on the substrate having the color filter 4 formed thereon, to form a flattening layer 5, the flattening layer 5 being used for flattening the color filter 4 to ensure continuity between the passivation-layer via hole and the pixel electrode, due to a relatively large thickness of the color filter 4. As illustrated in FIG. 4, Indium Tin Oxides (ITO) is deposited on the above-described substrate having the flattening layer 5 formed thereon, and a transparent electrode 6 is formed on the color filter by a patterning process. The transparent electrode 6 covers a region including the pixel electrode and the passivation-layer via hole, and is used as the pixel electrode and connected with the drain electrode of the TFT through the passivation-layer via hole. As illustrated in FIG. 5, a pixel defining layer 7 is formed on the above-described substrate including the transparent electrode 6, the pixel defining layer 7 is located around each sub-pixel, for separating adjacent sub-pixels, and cooperating with gate lines and data lines to ensure that light emitted by each sub-pixel will not affect other sub-pixels. On the above-described substrate including the pixel defining layer, an organic light-emitting layer and a metal electrode (not illustrated) are sequentially formed to complete the preparation of the backplane.

It can be seen that, the conventional fabrication process of the OLED backplane is relatively complicated.

SUMMARY OF THE INVENTION

An embodiment of the present invention provides a fabrication method of an OLED backplane, comprising:

Forming a pattern including a TFT on a substrate;

Forming a passivation layer on the substrate including the TFT pattern;

Forming a color filter on the substrate including the passivation layer;

Forming a resin layer on the substrate including the color filter;

Heavily doping the resin layer of a first region in each sub-pixel on the substrate including the resin layer, so that the resin layer in the first region is conductive, the first region including a passivation layer via-hole region, a pixel electrode region and a connecting region between the passivation layer via-hole region and the pixel electrode region, the passivation-layer via-hole region being a position where a drain electrode of the TFT is located;

Forming an organic light-emitting layer and a cathode sequentially on the substrate after the resin layer of the first region is heavily doped.

In one example, forming the resin layer on the substrate including the color filter includes:

Depositing a resin material on the substrate including the color filter;

Performing light exposure on the resin material in the pixel electrode region by half-tone exposure, performing deep exposure on the resin material in the passivation-layer via-hole region and a surrounding region thereof by half-tone exposure, so that a thickness of the remaining resin material in the passivation-layer via-hole region and the surrounding region thereof is less than a thickness of the remaining resin material in the pixel electrode region.

In one example, before forming the resin layer on the substrate including the color filter, the method further comprises:

Forming a passivation-layer via hole in the passivation layer in the passivation-layer via-hole region by a patterning process.

In one example, forming the resin layer on the substrate including the color filter includes:

Depositing a resin material on the substrate including the color filter;

Performing light exposure on the resin material in the pixel electrode region by half-tone exposure, performing deep exposure on the resin material surrounding the passivation-layer via-hole region by half-tone exposure, and performing full exposure on the resin material in the passivation-layer via-hole region, so that a thickness of the remaining resin material surrounding the passivation-layer via-hole region is less than a thickness of the remaining resin material in the pixel electrode region, and the resin material in the passivation-layer via-hole region is completely removed.

In one example, after performing full exposure on the resin material in the passivation-layer via-hole region, the method further comprises:

Forming a passivation-layer via hole in the passivation layer in the passivation-layer via-hole region by a patterning process.

In one example, heavily doping the resin layer of the first region in each sub-pixel on the substrate including the resin layer includes:

Performing ion implantation on the resin layer of the first region in each sub-pixel on the substrate including the resin layer;

Performing curing treatment on the resin layer after the ion implantation.

In one example, ion sources for the ion implantation are metal elements, phosphine or borane.

In one example, the resin layer is made of positive photoresist.

According to another embodiment of the present invention, there is provided an OLED backplane, comprising: a substrate; a TFT disposed on the substrate, a passivation layer covering the TFT, the passivation layer having a passivation-layer via hole disposed therein, the passivation-layer via hole being located in a position where a drain electrode of the TFT is located; a color filter disposed on the passivation layer; a resin layer covering the passivation-layer and the color filter; an organic light-emitting layer disposed on the resin layer, and a cathode disposed on the organic light-emitting layer, wherein the substrate includes a plurality of sub-pixels arranged in a matrix, each sub-pixel including a first region, the first region including a pixel electrode region, a passivation-layer via-hole region, and a connecting region between the passivation-layer via-hole region and the pixel electrode region, the resin layer in the first region being a heavily doped conductive region, the heavily doped resin layer being connected with the drain electrode of the TFT through the passivation-layer via hole.

In one example, a thickness of the resin layer in the pixel electrode region is greater than a thickness of the resin layer in a second region, the second region including the passivation-layer via-hole region and the surrounding region thereof;

A thickness of the resin layer except that in the pixel electrode region and the second region is greater than a thickness of the resin layer in the pixel electrode region.

In one example, a thickness of the resin material surrounding the passivation-layer via-hole region is less than a thickness of the resin material in the pixel electrode region, and there is no resin material in the passivation-layer via-hole region.

The OLED backplane and the fabrication method thereof provided by the present invention, can implement functions of the pixel electrode and the pixel defining layer only by heavily doping the resin layer, which saves steps of patterning process such as depositing and etching of the transparent electrode and the pixel defining layer in the prior art, so as to simplify the fabrication method and save the ITO material. In addition, in a process of using the OLED backplane in the prior art, a discharging phenomenon will occur on edges of the transparent electrode, resulting in damage to devices on the backplane; however, the resin layer in the present embodiments is a complete layer structure, which avoids the discharging phenomenon on the edges of the pixel electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

First Embodiment

An embodiment of the present invention provides a fabrication method of an OLED backplane, which may be specifically used for fabricating the OLED backplane of an Oxide TFT, the fabrication method comprising:

Step 101: forming a pattern including a TFT on a substrate 14;

The step specifically includes forming a gate electrode, a gate electrode insulating layer, an active layer, an etching barrier layer, a source electrode and a drain electrode 11.

Figure 1:
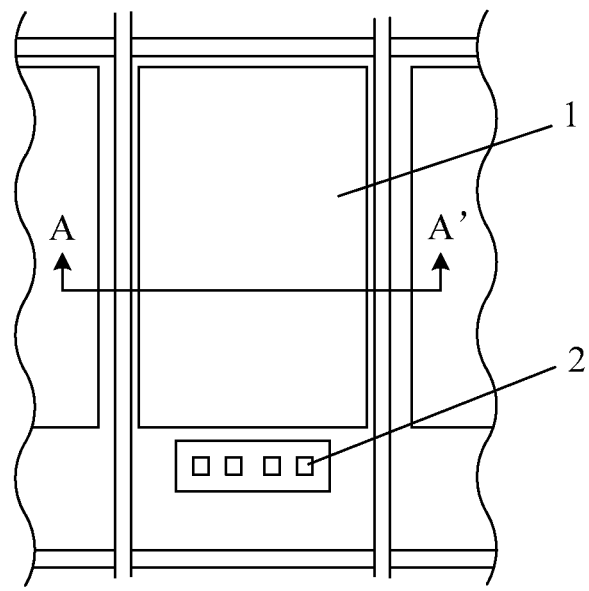
FIG. 1 is a schematic structural diagram of an OLED backplane in the prior art.
Figure 2:
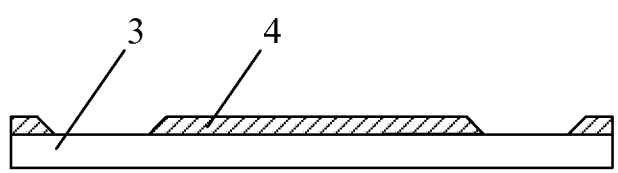
FIG. 2 to FIG. 5 are cross-sectional diagrams of the OLED backplane of FIG. 1 in an A-A' direction.
Figure 3:
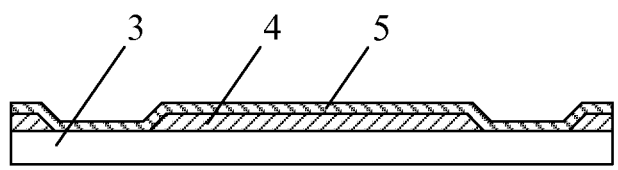
Figure 4:
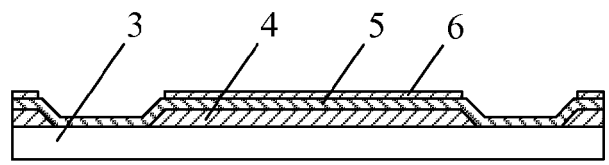
Figure 5:
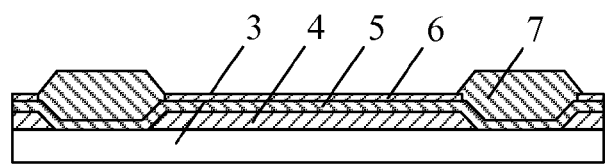
Figure 6:
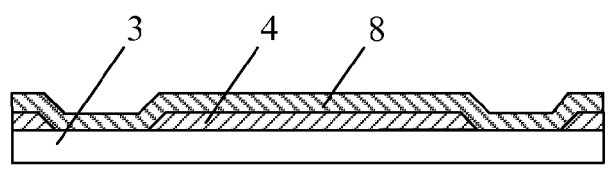
FIG. 6 is a cross-sectional schematic diagram of an OLED backplane according to an embodiment of the present invention.

Step 102: as illustrated in FIG. 6, forming a passivation layer 3 on the substrate 14 including the above-described TFT pattern;

Step 103: forming a color filter 4 on the substrate including the above-described passivation layer 3;

It specifically includes spin coating a color filter material on the substrate, and performing exposing, developing, and annealing sequentially.

Step 104: forming a resin layer 8 on the substrate including the above-described color filter 4;

It specifically includes spin coating a resin material, so that a thickness of the resin layer 8 is 3.5~4 μm, which is thicker than a flattening layer in the prior art by 1.5~2 μm; and it is specifically reducing a rate for spin coating the resin material, for example, from 850 rev/min to 600 rev/min.

Figure 7:
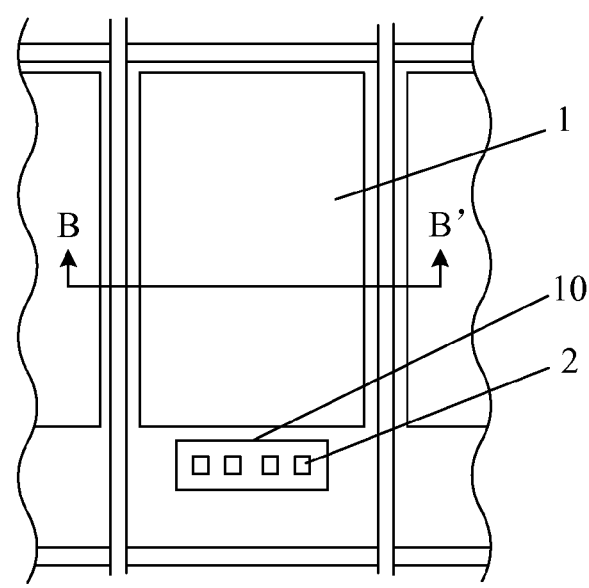
FIG. 7 is a structural schematic diagram of an OLED backplane according to an embodiment of the present invention.
Figure 11:
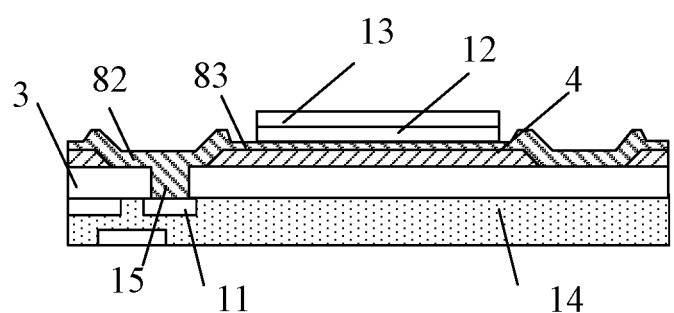

The substrate after step 104 is illustrated in FIG. 7, each sub-pixel including a pixel electrode region 1 and a passivation-layer via-hole region 2, wherein the pixel electrode region 1 has the above color filter 4 disposed thereon, and the passivation-layer via-hole region 2 is a position where the drain electrode 11 of the above-described TFT is located, as illustrated in FIG. 11 and at this time, a passivation-layer via hole 15 may have been formed or will be formed in a subsequent step, referring to the text described below for details.

Figure 8:
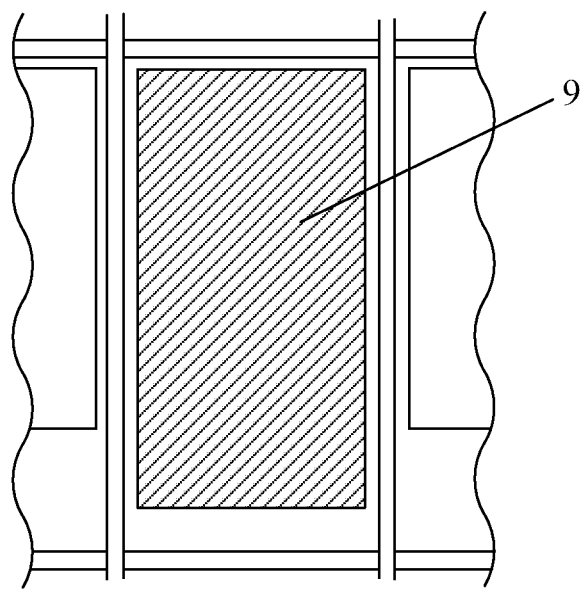
FIG. 8 is a schematic diagram of a region where the OLED backplane in FIG. 7 is heavily doped.

Step 105: as illustrated in FIG. 8, heavily doping the resin layer in a first region 9 in each sub-pixel on the above-described substrate including the resin layer, so that the resin layer in the first region 9 is conductive, the first region 9 including a passivation layer via-hole region, a pixel electrode region and a connecting region between the passivation layer via-hole region and the pixel electrode region, the passivation-layer via-hole region being a position where the drain electrode 11 of the TFT is located;

For example, the resin layer on the entire substrate can firstly function as a flattening layer; since the resin layer in the first region 9 is conductive, it can be used as the pixel electrode and be connected with the drain electrode 11 of the TFT through the passivation-layer via hole 15; in addition, since the resin layer outside the first region 9 is not doped, i.e., it remains as an insulator, it can be used as a pixel defining layer, for separating adjacent sub-pixels, and cooperating with gate lines and data lines to ensure that the light emitted by each sub-pixel will not affect other sub-pixels.

Step 106: forming an organic light-emitting layer and a cathode (not illustrated) sequentially on the above-described substrate after the resin layer in the first region is heavily doped, the above-described resin layer in the heavily doped pixel region serving as an anode.

For example, in the above step 105, heavily doping the resin layer of the first region in each sub-pixel on the substrate including the above-described resin layer includes:

Step 1051: performing ion implantation on the resin layer of the first region in each sub-pixel on the above-described substrate including the resin layer;

Step 1052: performing curing treatment on the above-described resin layer after the ion implantation.

For example, ion sources for the ion implantation are metal elements, phosphine or borane, etc. For example, in the above-described ion implantation, ions can be implanted into a predetermined region of the resin layer by using a mask, having an opening region (a region where the ions can pass through), for example, corresponding to the first region in each sub-pixel.

The OLED backplane obtained by the fabrication method of the OLED backplane in this embodiment, can implement the functions of the pixel electrode and the pixel defining layer only by heavily doping the resin layer, which saves steps of the patterning process such as depositing and etching of the transparent electrode and the pixel defining layer in the prior art, so as to simplify the fabrication method and save the ITO material. In addition, in a process of using the OLED backplane in the prior art, a discharging phenomenon will occur on edges of the transparent electrode, resulting in damage to devices on the backplane; however, the resin layer in this embodiment is a whole layer structure, which avoids the discharging phenomenon on the edges of the pixel electrode.

Second Embodiment

Figure 9:
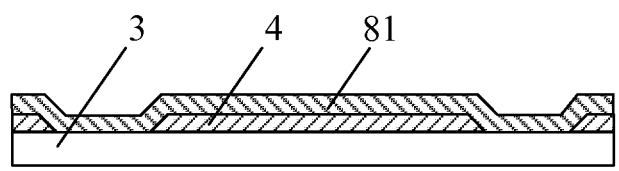
FIG. 9, FIG. 10 and FIG. 11 are cross-sectional schematic diagrams of the OLED backplane in a B-B' direction in FIG. 7.
Figure 10:
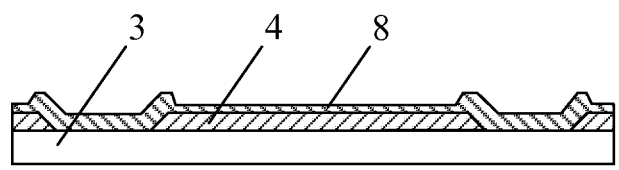

Based on the first embodiment, an embodiment of the present invention provides a fabrication method of an OLED backplane, wherein, In the above step 104, forming the resin layer on the substrate including the above-described color filter includes:

Step 1041: as illustrated in FIG. 9, depositing a resin material 81 on the substrate including the color filter 4;

Step 1042: as illustrated in FIG. 10, performing light exposure on the resin material in the pixel electrode region 1 by half-tone exposure, performing deep exposure on the resin material in the passivation-layer via-hole region 2 and the surrounding region thereof by half-tone exposure, to finally form the resin layer 8 illustrated in FIG. 10.

For example, wherein, the light exposure is performed on the resin material in the pixel electrode region 1, so that the resin layer in the region becomes thinner, to further ensure conductivity of the heavily doped resin layer in the region; similarly, the deep exposure is performed on the resin material in the passivation-layer via-hole region 2 and the surrounding region thereof, so that the resin layer in the region is only kept as a very thin layer, to further ensure conductivity of the heavily doped resin layer in the region, and ensure a good ohmic contact between the resin layer in the region and a drain electrode 11 of the TFT. For example, the resin layer is made of positive photoresist. After exposure and development are performed on the resin layer, a thickness of the remaining resin material 82 in the passivation-layer via-hole region and the surrounding region thereof is less than a thickness of the remaining resin material 83 in the pixel electrode region, as illustrated in FIG. 11.

For example, the above step 104, before forming the resin layer on the substrate including the above-described color filter, may further include:

Step 1040: forming a passivation-layer via hole 15 in the passivation-layer via-hole region 2 on the passivation layer by a patterning process.

For example, step 1040 may be performed between step 102 and step 103 as described above, or step 1040 may be performed between step 103 and step 104 as described above. Step 1040 can be carried out as long as the passivation layer has been formed on the substrate. After the passivation-layer via hole 15 is formed, the deposited resin material connects the pixel electrode and the drain electrode 11 of the TFT through the passivation-layer via hole 15.

The OLED backplane obtained by the fabrication method of the OLED backplane in this embodiment, can implement the functions of the pixel electrode and the pixel defining layer only by heavily doping the resin layer, which saves steps of the patterning process such as depositing and etching of the transparent electrode and the pixel defining layer in the prior art, so as to simplify the fabrication method and save the ITO material. In addition, in a process of using the OLED backplane in the prior art, a discharging phenomenon will occur on edges of the transparent electrode, resulting in damage to devices on the backplane; however, the resin layer in this embodiment is a whole layer structure, which avoids the discharging phenomenon at the edges of the pixel electrode.

Third Embodiment

Based on the first embodiment, an embodiment of the present invention provides a fabrication method of an OLED backplane, wherein, In the above step 104, forming the resin layer 8 on the substrate including the above-described color filter 4 includes:

Step 1041: depositing a resin material on the substrate including the color filter 4;

Step 1043: performing light exposure on the resin material in the pixel electrode region 1 by half-tone exposure, performing deep exposure on the resin material surrounding the passivation-layer via-hole region 2 by half-tone exposure, and performing full exposure on the resin material in the passivation-layer via-hole region 2. For example, the resin layer may be made of positive photoresist. After the processes of exposure and development are performed on the resin layer, a thickness of the remaining resin material 82 surrounding the passivation-layer via-hole region may be less than a thickness of the remaining resin material 83 in the pixel electrode region, and the resin material in the passivation-layer via-hole region is completely removed.

For example, step 1043 is similar to step 1042 in the second embodiment, only differing in that, in step 1043, the full exposure is further performed on the resin material in the passivation-layer via-hole region 2, so that there is no resin material in the passivation-layer via-hole region 2.

The above-described step 1043, after the performing full exposure on the resin material in the passivation-layer via-hole region 2, further includes:

Step 1044: forming a passivation-layer via hole 15 in the passivation-layer via-hole region 2 on the passivation layer 3 by a patterning process.

For example, since after step 1043, only the passivation-layer via-hole region 2 has no resin material, in step 1044, the passivation-layer via hole 15 can be etched by directly using the previous resin layer as a mask, without necessity to separately fabricate the passivation-layer via hole 15 by a complete patterning process as in the second embodiment, so that the fabrication of the passivation-layer via hole 15 is simpler. Since there are steps for forming the organic light-emitting layer 12 and the cathode 13 sequentially after the passivation-layer via hole 15 has been fabricated as illustrated in FIG. 11, after the organic light-emitting layer 12 is formed, the resin layer surrounding the passivation-layer via-hole region 2 is connected with the drain electrode 11 of the TFT by the organic light-emitting layer 12 in the passivation-layer via hole 15.

The OLED backplane obtained by the fabrication method of the OLED backplane in this embodiment, can implement the functions of the pixel electrode and the pixel defining layer only by heavily doping the resin layer, which saves steps of the patterning process such as depositing and etching of the transparent electrode and the pixel defining layer in the prior art, so as to simplify the fabrication method and save the ITO material. In addition, in a process of using the OLED backplane in the prior art, a discharging phenomenon will occur on edges of the transparent electrode, resulting in damage to devices on the backplane; however, the resin layer in this embodiment is a whole layer structure, which avoids the discharging phenomenon on the edges of the pixel electrode.

Fourth Embodiment

This embodiment provides an OLED backplane, which may be obtained by the fabrication method according to the first embodiment, the second embodiment or the third embodiment, as illustrated in FIG. 7, FIG. 8 and FIG. 9; the OLED backplane comprises: a substrate; a TFT (not illustrated) disposed on the substrate, a passivation layer 3 covering the above-described TFT, the passivation layer 3 having a passivation-layer via hole 15 disposed therein, the above-described passivation-layer via hole 15 being located in a position where a drain electrode 11 of the above-described TFT is located; a color filter 4 disposed on the passivation layer 3; it further comprises: a resin layer 8 covering the passivation-layer 3 and the color filter 4; the above-described substrate including a plurality of sub-pixels arranged in a matrix, each sub-pixel including a first region 9, the first region 9 including a pixel electrode region 1, a passivation-layer via-hole region 2, and a connecting region between the passivation-layer via-hole region 2 and the pixel electrode region 1, the resin layer 8 in the first region 9 being a heavily doped conductive region, the above-described heavily doped resin layer 8 being connected with the drain electrode 11 of the TFT through the passivation-layer via hole 15; an organic light-emitting layer (not illustrated) disposed on the resin layer 8, and a cathode (not illustrated) disposed on the above-described organic light-emitting layer.

Further, a thickness of the resin layer of the pixel electrode region 1 is greater than a thickness of the resin layer of a second region 10, the second region 10 including the passivation-layer via-hole region 2 and the surrounding region thereof; and a thickness of the resin layer except that in the pixel electrode region 1 and the second region 10 is greater than a thickness of the resin layer in the pixel electrode region 1.

Specific structure and principles of the OLED backplane according to this embodiment is identical with those of the above-described embodiments, which will not be repeated here.

The OLED backplane in this embodiment can implement the functions of the pixel electrode and the pixel defining layer only by heavily doping the resin layer, which saves steps of the patterning process such as depositing and etching of the transparent electrode and the pixel defining layer in the prior art, so as to simplify the fabrication method and save the ITO material. In addition, in a process of using the OLED backplane in the prior art, a discharging phenomenon will occur on edges of the transparent electrode, resulting in damage to devices on the backplane; however, the resin layer according to this embodiment is a whole layer structure, which avoids the discharging phenomenon on the edges of the pixel electrode.

The foregoing embodiments merely are exemplary embodiments of the invention, and not intended to define the scope of the invention, and the scope of the invention is determined by the appended claims.

The present application claims priority of Chinese Patent Application No. 201310492625.X filed on Oct. 18, 2013, the disclosure of which is incorporated herein by reference in its entirety as part of the present application.

What is claimed is:

1. A fabrication method of an Organic Light-Emitting Diode (OLED) backplane, comprising:
    forming a pattern including a thin film transistor (TFT) on a substrate;
    forming a passivation layer on the substrate including the TFT pattern;
    forming a color filter on the substrate including the passivation layer;
    forming a resin layer on the substrate including the color filter;
    heavily doping a resin layer of a first region in each sub-pixel on the substrate including the resin layer, so that the resin layer of the first region is conductive, the resin layer including the first region, the first region including a passivation-layer via-hole region, a pixel electrode region and a connecting region between the passivation-layer via-hole region and the pixel electrode region, the passivation-layer via-hole region being a position where a drain electrode of the TFT is located; and
    forming an organic light-emitting layer and a cathode sequentially on the substrate after the resin layer of the first region is heavily doped,
    wherein the heavily doped resin layer is connected with the drain electrode of the TFT through a passivation-layer via hole.

2. The fabrication method of the OLED backplane according to claim 1, wherein, forming the resin layer on the substrate including the color filter includes:
    depositing a resin material on the substrate including the color filter; and
    performing light exposure on resin material in the pixel electrode region by half-tone exposure, performing deep exposure on resin material in the passivation-layer via-hole region and a surrounding region thereof by half-tone exposure, so that a thickness of remaining resin material in the passivation-layer via-hole region and the surrounding region thereof is less than a thickness of remaining resin material in the pixel electrode region.

3. The fabrication method of the OLED backplane according to claim 1, wherein, before forming the resin layer on the substrate including the color filter, the method further comprises:
forming the passivation-layer via hole in the passivation layer in the passivation-layer via-hole region by a patterning process.

4. The fabrication method of the OLED backplane according to claim 1, wherein, forming the resin layer on the substrate including the color filter includes:
depositing a resin material on the substrate including the color filter; and
performing light exposure on the resin material in the pixel electrode region by half-tone exposure, performing deep exposure on the resin material surrounding the passivation-layer via-hole region by half-tone exposure, and performing full exposure on the resin material in the passivation-layer via-hole region, so that a thickness of the remaining resin material surrounding the passivation-layer via-hole region is less than a thickness of the remaining resin material in the pixel electrode region, and the resin material in the passivation-layer via-hole region is completely removed.

5. The fabrication method of the OLED backplane according to claim 4, wherein, after performing full exposure on the resin material in the passivation-layer via-hole region, the method further comprises:
forming the passivation-layer via hole in the passivation layer in the passivation-layer via-hole region by a patterning process.

6. The fabrication method of the OLED backplane according to claim 1, wherein, heavily doping the resin layer of the first region in each sub-pixel on the substrate including the resin layer includes:
performing ion implantation on the resin layer of the first region in each sub-pixel on the substrate including the resin layer; and
performing curing treatment on the resin layer after the ion implantation.

7. The fabrication method of the OLED backplane according to claim 6, wherein, ion sources for the ion implantation are metal elements, phosphine or borane.

8. The fabrication method of the OLED backplane according to claim 1, wherein, the resin layer is made of positive photoresist.

9. An Organic Light-Emitting Diode (OLED) backplane, comprising:
a substrate;
a TFT disposed on the substrate;
a passivation layer covering the TFT, the passivation layer having a passivation-layer via hole disposed therein, the passivation-layer via hole being located in a position where a drain electrode of the TFT is located;
a color filter disposed on the passivation layer;
a resin layer covering the passivation-layer and the color filter;
an organic light-emitting layer disposed on the resin layer; and
a cathode disposed on the organic light-emitting layer,
wherein the substrate includes a plurality of sub-pixels arranged in a matrix, each sub-pixel including a first region, the resin layer including the first region, the first region including a pixel electrode region, a passivation-layer via-hole region, and a connecting region between the passivation-layer via-hole region and the pixel electrode region, resin layer in the first region being a heavily doped conductive resin layer, the heavily doped conductive resin layer being connected with the drain electrode of the TFT through the passivation-layer via hole.

10. The OLED backplane according to claim 9, wherein, a thickness of a resin layer in the pixel electrode region is greater than a thickness of a resin layer in a second region, the second region including the passivation-layer via-hole region and a surrounding region thereof; and
a thickness of a resin layer except that in the pixel electrode region and the second region is greater than a thickness of the resin layer in the pixel electrode region.

11. The OLED backplane according to claim 9, wherein, a thickness of resin material surrounding the passivation-layer via-hole region is less than a thickness of resin material in the pixel electrode region, and there is no resin material in the passivation-layer via-hole region.

12. The OLED backplane according to claim 9, wherein, the resin layer in the first region is doped with metal elements, phosphine or borane.

13. The OLED backplane according to claim 9, wherein, the resin layer is made of positive photoresist.

14. The fabrication method of the OLED backplane according to claim 2, wherein, before forming the resin layer on the substrate including the color filter, the method further comprises:
forming the passivation-layer via hole in the passivation layer in the passivation-layer via-hole region by a patterning process.

15. The fabrication method of the OLED backplane according to claim 2, wherein, heavily doping the resin layer of the first region in each sub-pixel on the substrate including the resin layer includes:
performing ion implantation on the resin layer of the first region in each sub-pixel on the substrate including the resin layer; and
performing curing treatment on the resin layer after the ion implantation.

16. The fabrication method of the OLED backplane according to claim 3, wherein, heavily doping the resin layer of the first region in each sub-pixel on the substrate including the resin layer includes:
performing ion implantation on the resin layer of the first region in each sub-pixel on the substrate including the resin layer; and
performing curing treatment on the resin layer after the ion implantation.

17. The fabrication method of the OLED backplane according to claim 4, wherein, heavily doping the resin layer of the first region in each sub-pixel on the substrate including the resin layer includes:
performing ion implantation on the resin layer of the first region in each sub-pixel on the substrate including the resin layer; and
performing curing treatment on the resin layer after the ion implantation.

18. The fabrication method of the OLED backplane according to claim 2, wherein, the resin layer is made of positive photoresist.

19. The fabrication method of the OLED backplane according to claim 3, wherein, the resin layer is made of positive photoresist.

20. The fabrication method of the OLED backplane according to claim 4, wherein, the resin layer is made of positive photoresist.

* * * * *